(12) United States Patent
Page et al.

(10) Patent No.: US 7,981,707 B2
(45) Date of Patent: Jul. 19, 2011

(54) METHOD FOR ENHANCING OPTICAL CHARACTERISTICS OF MULTILAYER OPTOELECTRONIC COMPONENTS

(75) Inventors: Hideaki Page, Palaiseau (FR); Carlo Sirtori, Paris (FR); Alfredo De Rossi, Paris (FR)

(73) Assignee: Thales (FR)

( * ) Notice: Subject to any disclaimer, the term of this patent is extended or adjusted under 35 U.S.C. 154(b) by 894 days.

(21) Appl. No.: 10/499,197

(22) PCT Filed: Dec. 17, 2002

(86) PCT No.: PCT/FR02/04396
§ 371 (c)(1),
(2), (4) Date: Jun. 30, 2005

(87) PCT Pub. No.: WO03/055021
PCT Pub. Date: Jul. 3, 2003

(65) Prior Publication Data
US 2005/0249473 A1    Nov. 10, 2005

(30) Foreign Application Priority Data

Dec. 20, 2001  (FR) .................................. 01 16556

(51) Int. Cl.
H01L 21/00 (2006.01)
(52) U.S. Cl. ................ 438/31; 438/22; 438/29; 438/32; 438/45; 438/520; 438/528
(58) Field of Classification Search .............. 372/96, 372/46.015; 427/523; 438/519, 520, 527, 438/523, 22, 29, 31, 32, 45, 528
See application file for complete search history.

(56) References Cited

U.S. PATENT DOCUMENTS

| | | | | |
|---|---|---|---|---|
| 3,912,546 A | * | 10/1975 | Hunsperger et al. | 438/174 |
| 3,918,996 A | * | 11/1975 | Morgan | 438/357 |
| 3,936,322 A | * | 2/1976 | Blum et al. | 438/45 |
| 4,116,717 A | * | 9/1978 | Rahilly | 136/255 |
| 4,452,646 A | * | 6/1984 | Zuleeg | 438/194 |
| 4,840,816 A | * | 6/1989 | Appleton et al. | 427/526 |
| 5,337,328 A | * | 8/1994 | Lang et al. | 372/45.01 |
| 5,457,709 A | * | 10/1995 | Capasso et al. | 372/45.01 |
| 5,502,787 A | * | 3/1996 | Capasso et al. | 385/123 |
| 5,539,766 A | * | 7/1996 | Ishino et al. | 372/96 |
| 5,600,483 A | * | 2/1997 | Fan et al. | 359/245 |

(Continued)

FOREIGN PATENT DOCUMENTS

EP  0 895 323 A1  *  2/1999

OTHER PUBLICATIONS

M. A. Duguay, Y. Kokubun, and T. L. Koch, "Antiresonant reflecting optical waveguides in SiO2-Si multilayer structures," Appl. Phys. Lett. 49, 13 (198 6).*
Robert J Lang et al., "Theory of Grating—Confined Broad-Area Lasers," IEEE J. Quantum Electron. 34, 2196 (1998).*
Sirtori C et al: "Low-Loss Al-Free Waveguides for Unipolar Semiconductor Lasers" Applied Physics Letters. New York, US, vol. 75 No. 25 Dec. 20, 1999 pp. 3911-3913.

(Continued)

*Primary Examiner* — Kevin M Picardat
*Assistant Examiner* — Bac H Au
(74) *Attorney, Agent, or Firm* — Lowe Hauptman Ham & Berner, LLP

(57) ABSTRACT

The method of the invention consists of implanting ions into the surface of multilayer optical waveguides, in the highly doped layer, in a defined pattern so as to modify the refractive index of this layer.

21 Claims, 3 Drawing Sheets

U.S. PATENT DOCUMENTS

| | | | | |
|---|---|---|---|---|
| 5,703,989 A | * | 12/1997 | Khan et al. | 385/130 |
| 5,717,707 A | * | 2/1998 | Beernink et al. | 372/46.016 |
| 5,936,989 A | * | 8/1999 | Capasso et al. | 372/45.012 |
| 5,963,571 A | * | 10/1999 | Wingreen | 372/45.01 |
| 5,963,799 A | * | 10/1999 | Wu | 438/199 |
| 6,072,812 A | * | 6/2000 | Eng | 372/20 |
| 6,122,299 A | * | 9/2000 | DeMars et al. | 372/20 |
| 6,194,242 B1 | * | 2/2001 | Uchiya | 438/48 |
| 6,597,721 B1 | * | 7/2003 | Hutchinson et al. | 372/98 |
| 6,738,404 B1 | | 5/2004 | Berger | |
| 2005/0163186 A1 | * | 7/2005 | Petersen | 372/93 |
| 2006/0215720 A1 | * | 9/2006 | Corzine et al. | 372/50.11 |

OTHER PUBLICATIONS

Orth A et al: "First-Order Gain-Coupled (GA,IN) As (AL, GA) As Distributed Feedback Lasers By Focused Ion Beam Implantation and in Situ Overgrowth" Journal of Vacuum Science and Technology: Part B, American Institute of Physics, New York, US, vol. 13, No. 6, Nov. 1, 1995.

Moutonnet D: "Optical Losses in 0/sup +/and B/sup+/implanted GaAs for stripe laser" IEE Journal on Solid State and Electron Devices, Sep. 1997, UK.

* cited by examiner

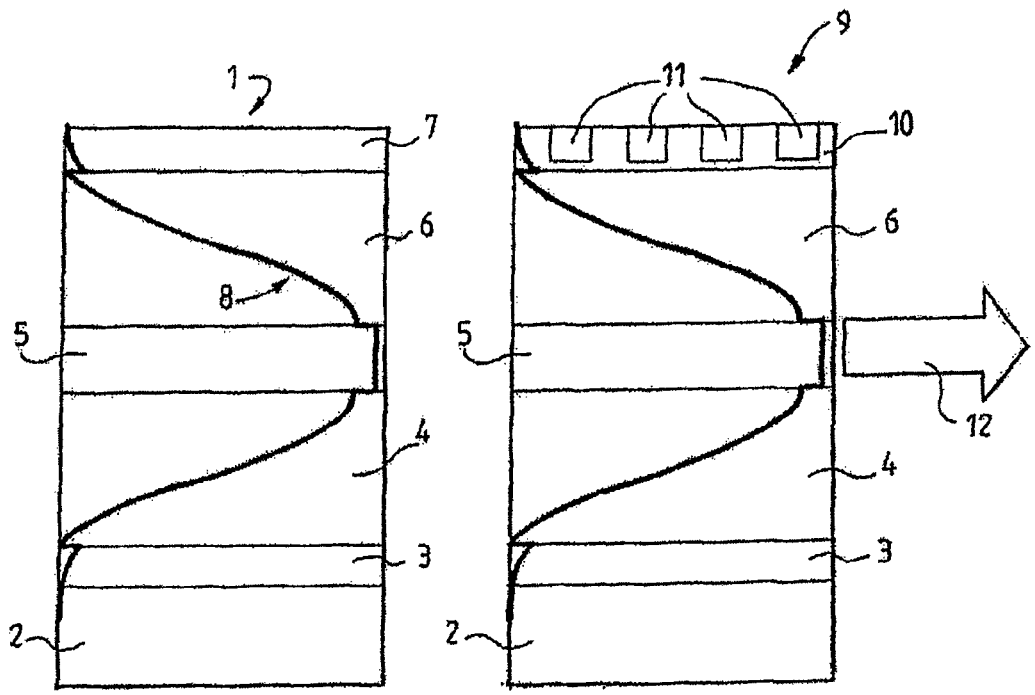
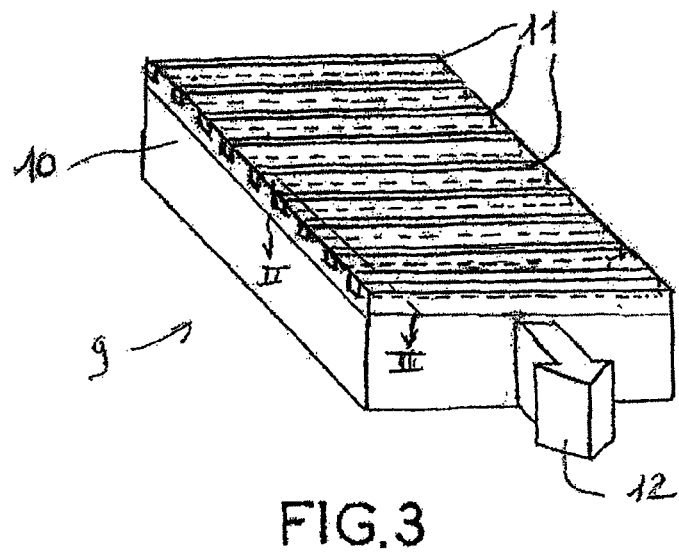
FIG.1 (PRIOR ART)
FIG.2
FIG.3

METHOD FOR ENHANCING OPTICAL CHARACTERISTICS OF MULTILAYER OPTOELECTRONIC COMPONENTS

CROSS REFERENCE TO RELATED APPLICATIONS

The present Application is based on International Application No. PCT/FR02/04396, filed on Dec. 17, 2002, which in turn corresponds to FR 01/16556 filed on Dec. 20, 2001, and priority is hereby claimed under 35 USC §119 based on these applications. Each of these applications are hereby incorporated by reference in their entirety into the present application.

FIELD OF THE INVENTION

The present invention relates to a method of improving the optical characteristics of multilayer optoelectronic components.

DESCRIPTION OF RELATED ART

Optoelectronic components, such as quantum cascade lasers (QCLs) or optical waveguides with vertical optical confinement, comprise surface layers that are highly doped and having a high refractive index gradient compared with the subjacent layers.

Many applications of optoelectronic components require the optical field prevailing therein to exhibit well defined spectral and spatial qualities. Furthermore, it is desirable to be able to control the optical mode of these components so as to be able to increase their performance. In this regard, mention may be made, by way of non-limiting example, of two applications requiring control of the optical mode.

DFB (distributed feedback)-type lasers have been widely employed in recent years. This technology allows the bandwidth and monomode operation characteristics of semiconductor lasers to be greatly improved, these characteristics being essential in optical fiber telecommunication applications.

However, in high-power applications, which require a mode having large dimensions, the DFB technology is unsuitable for controlling the transverse structure of the mode. This limits their use for high-power laser applications. Other solutions are conceivable, especially what are called "α-DFB" lasers, the concept of which is also compatible with the fabrication process proposed in the present application.

To be able to carry out these applications, multilayer optoelectronic components are used whose refractive index varies periodically or pseudo-periodically. Such components are being increasingly used in modern optoelectronic devices for controlling the spatial and spectral coherence of their optical field.

To fabricate these variable-index optoelectronic components, the known techniques of CAIBE (chemical assisted ion beam etching) or RIE (reactive ion etching) are employed. However, the etching process by itself may lead to a rough surface finish, and consequently to optical losses induced by scattering. Chemical etching allows the roughness of the etched surfaces to be reduced. However, it is difficult to control this chemical etching process, in particular for small structures (with dimensions of less than 1 μm), and this process is difficult to reproduce; and, in most cases, the etching is selective and anisotropic. Often, structures etched in this way may be incompatible with the deposition of electrical contact layers. Furthermore, it may be difficult in certain cases to mount the components with the epitaxially grown face downward, with a view to improving the heat sink characteristics.

Finally, the coupling of the optical field into the optoelectronic component may be weak owing to the fact that the etched part is usually found to be the surface layer.

SUMMARY OF THE INVENTION

The subject of the present invention is a method of producing multilayer optoelectronic components with a large local variation in refractive index, the components produced using this method having the best possible optical properties, being easily reproducible, being able to be provided with, where appropriate, electrical contact layers and being able to be mounted so as to exhibit good thermal dissipation properties.

The subject of the present invention is also optoelectronic components produced using this method, the cost of these components being the lowest possible.

The method according to the invention consists in implanting ions into discrete regions of a highly doped layer so that the concentration of the doping and therefore the refractive index of this layer are locally modified.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

The present invention will be more clearly understood on reading the detailed description of several embodiments, given by way of non-limiting examples and illustrated by the appended-drawing in which:

FIG. 1 is a cross-sectional view of an optical waveguide of the prior art;

FIG. 2 is a cross-sectional view similar to that of FIG. 1, but relating to an optical waveguide produced using the method of the invention;

FIG. 3 is a simplified perspective view of an optical waveguide produced using the method of the invention;

DETAILED DESCRIPTION OF THE INVENTION

Figure 4:
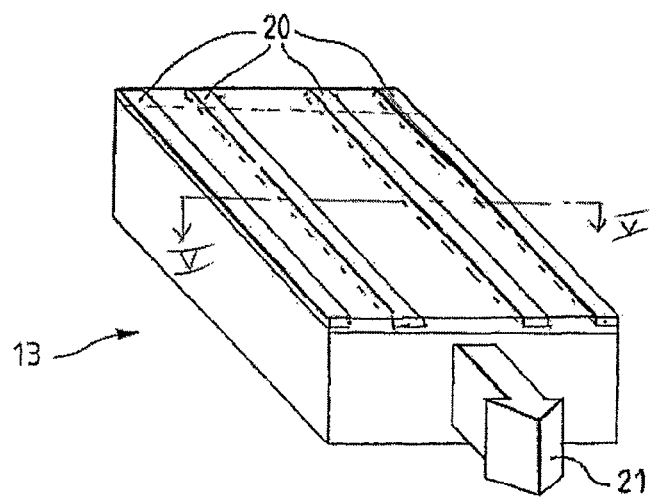
FIG. 4 is a perspective view of a waveguide of the "horizontal arrow" type produced using the method of the invention.

The present invention is mainly characterized by the ion or proton implantation into plasma-effect multilayer optical waveguides with a view to producing active bandgap optoelectronic components.

A plasma-effect multilayer waveguide relies on plasma resonance in highly doped layers for obtaining a large refractive index gradient needed for effective optical confinement. For wavelengths lying within the mid-infrared or the far-infrared, this solution is more viable than modifying the composition of the alloys—alloys such as $Al_xGa_{(1-x)}As$—of the layers whose bandgap lies within the visible or near infrared. Among the components in question, mention may be made of those having an inter-bandgap transition, such as QCLs (quantum cascade lasers).

The technology of producing bandgap optoelectronic components according to the invention becomes more useful when the operating wavelength of these components increases, owing to the fact that the dimensions of these components increase and that they are therefore easier to fabricate, thus reducing the requirements in terms of surface roughness. Furthermore, the distortions due to temperature have less of an impact in the far infrared, making it possible to produce interferential photonic bandgap components.

According to the invention, patterns may be produced on optoelectronic components that produce a large modulation in the refractive index by a corresponding modulation of the local doping of these components, the doping being modified by implanting ions or protons depending on these patterns. Furthermore, these patterns are not necessarily formed on the surface, but may also be formed in the depth if the energy of the implantation beams is increased. The invention provides for the formation of periodic or pseudo-periodic patterns directly in the layers of the waveguides, thus making it possible to obtain strong coupling with the optical field, necessary for good operation of photonic bandgap components. A photonic structure obtained by ion implantation allows the production of electrical contacts on the component, since current can flow via the regions that have not undergone implantation (the patterns occupy only part of the layer on which the conducting metal layer has to be deposited). In addition, a plane surface finish is maintained owing to the fact that the patterned structure is implanted depthwise. It is then possible to mount these components with the active region downward, so as to improve the heat dissipation thereof, as is already done in the case of power laser diodes.

FIG. 1 shows, in a simplified sectional view, an optical waveguide 1 with highly doped (plasmon-enhanced) layers of the prior art. This waveguide 1 comprises, in succession, on a substrate 2, a first highly doped layer 3, a first coating layer 4, a layer 5 forming the active region, and a second highly doped layer 7. In one embodiment, the typical thicknesses of the layers 3 to 7 are 1 µm, 3.5 µm, 1.7 µm, 3.5 µm and 1 µm respectively. Curve 8 represents the change in optical mode in the various layers of the component 1. The layers 3 and 7 are highly doped (about 100 times more so than the layers 4 and 6) so as to obtain, relative to the latter layers, a large refractive index contrast needed for confining the optical mode in the waveguide. The population of free carriers is large, which means that the "plasma frequency" of the layers 3 and 7 is close to the frequency corresponding to the operating wavelength of the component 1. The large refractive index contrast of the layers 3 and 7 compared with that of the layers 4 and 6 is put to advantage in producing an optical waveguide. Such optical waveguides have been used to produce quantum cascade lasers operating in the mid-infrared.

According to the invention, and as illustrated schematically in FIG. 2, ions or protons are implanted into the second highly doped layer (corresponding to the layer 7 in FIG. 1) so as to greatly reduce its doping in certain regions. These regions are arranged in a defined pattern which can be formed either with the aid of a mask or by controlling the deflection of an implantation beam. Such an implantation has the result of reducing the effect of the free carriers of the said layer (which is highly doped before the implantation) on the refractive index of the layer in the regions involved in the implantation. As a result, complex local variations in the refractive index of the layer in question are thus obtained. These variations follow the pattern formed by the implantation regions and they are a function both of the ion bombardment doses and of the spatial variations in the intensity of this bombardment; they also may have a significant effect on the formation of the optical mode in the component treated.

The waveguide 9 shown in FIG. 2 has the same layers 2 to 6 as the component 1 of FIG. 1. Only the upper layer 10, which had, before the ion bombardment treatment, the same characteristics as the layer 7 of the component 1, includes aperiodic or quasi-periodic pattern of implanted regions 11, extending over the entire width of the component, as may be seen in FIG. 3 (the longitudinal direction of the component 9 is the direction of the laser beam 12 passing through the component during its use). In the present case, the regions 11 are regularly spaced and occupy a large part of the thickness of the layer 10, but it is fully understood that for other embodiments the implanted regions may have other characteristics, depending on the desired characteristics of the treated components, that is to say depending on the profiles of the optical modes that it is desired to obtain.

One possible application of the invention is in the production of DFB lasers which then have a structure similar to that shown in FIGS. 2 and 3.

Figure 5:
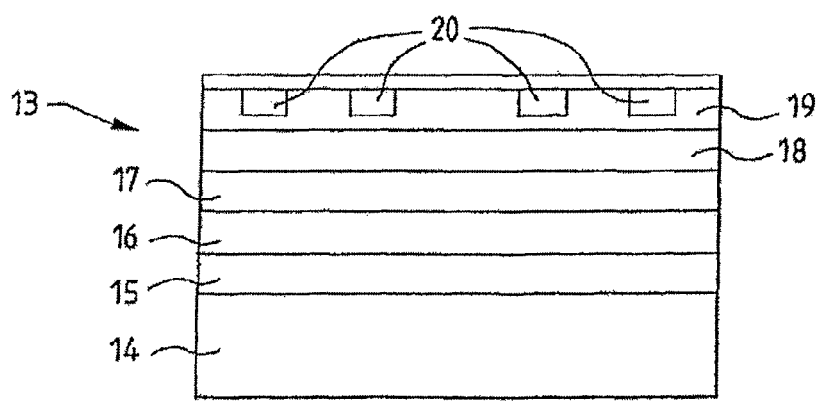
FIG. 5 is a simplified sectional view of the device of FIG. 4.

FIGS. 4 and 5 show an optical waveguide of the ARROW (antiresonant reflecting optical waveguide) type which provides excellent confinement in thin layers having a refractive index less than that of the substrate. This confinement may be of the horizontal type in planar optical waveguides.

The waveguide shown in FIGS. 4 and 5 is produced according to the invention in the following manner. This waveguide 13 is formed conventionally from a substrate 14 on which are deposited, in order, a highly doped layer 15, a coating layer 16, an active region layer 17, a coating layer 18 and a highly doped layer 19. According to the invention, a pattern of "bars" 20 is implanted into the layer 19, said bars being parallel to one another and parallel to the path of the laser beam 21 passing through the waveguide in the operating regime (it should be pointed out in this regard that, in the embodiment shown in FIGS. 2 and 3, the "bars" 11 were perpendicular to the path of the laser beam in operation). In the example illustrated in FIGS. 4 and 5, several bars 20 have been implanted, but only the four central bars have been shown.

Figure 6:
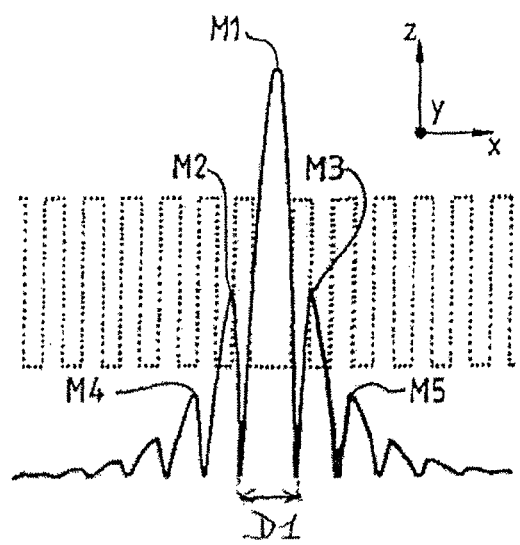
FIG. 6 is a diagram illustrating the relative variations i the refractive index in the width direction of the laser of FIG. 5.

FIG. 6 shows the variations in relative refractive index (by the broken line) and the variations in intensity of the optical field (by the solid line) along a transverse axis Ox (perpendicular to the direction of the laser beam 21). It should be noted that the intensity of the optical field is a maximum (at M1) in the middle of the width of the waveguide, i.e. in the middle of the width region D1; this intensity then has points M2 and M3 (that are symmetrical with respect to the position of M1) of lower amplitude than at M1, in the first following inter-bar regions, then points M4 and M5 of even lower amplitude in the second following inter-bar regions, and so on as far as the lateral ends of the waveguide where the intensity of the field is virtually zero.

The refractive index is a minimum in line with the inter-bar regions and a maximum in line with the bars—the maxima are mutually identical, and the minima are mutually identical.

ARROW optical waveguides have major advantages from the optical standpoint compared with conventional optical waveguides with confinement in a material of high refractive index. Firstly, they are the site of only a single transverse optical mode, whatever the size of the mode. In addition, it is easy to produce coupling between waveguides and phase gratings for high-brightness semiconductor lasers. Furthermore, it is possible to immunize the waveguides against the phenomenon of gain spatial hole burning.

Figure 7:
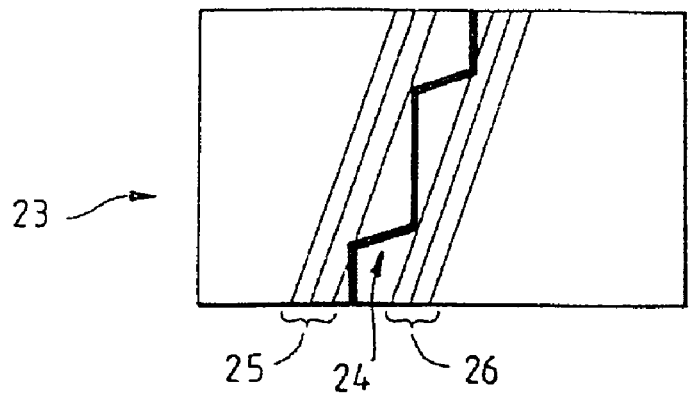
FIG. 7 is a simplified sectional view of an α-DFB laser, i.e. a waveguide with a zig-zag path, produced using the method of the invention.

FIG. 7 shows schematically a partial top view of an α-DFB laser with an oblique periodic structure. Such a laser may be a power laser formed in a wide waveguide strip, with diffraction-limited output. This periodic structure is in the form of an angular pattern, which forces the light to follow a zig-zag path in the waveguide. As a consequence, the angular dependence of the optical reaction is substantially increased, thus allowing only oscillation of the modes arriving at normal incidence on the front face of the waveguide. The DFB structure means that the spectral width is small.

FIG. 7 shows an optical waveguide 23 configured as a DFB laser in which a narrow "corridor" 24 is bounded by two strips 25, 26 with a high refractive index gradient. These two strips are produced, according to the invention, by ion implantation of patterns into the thickness of the waveguide in planes parallel to the axis of the corridor 24.

Figure 8:
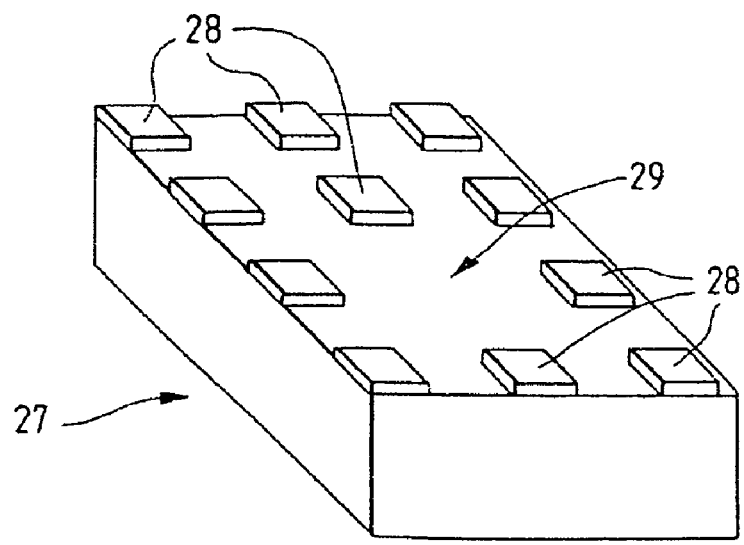
FIG. 8 is a simplified perspective view of a laser component with a two-dimensional grating of ion implantation points produced using the method of the invention.

FIG. 8 shows one possible embodiment of a two-dimensional photonic bandgap laser cavity 27 according to the invention. This cavity 27 is produced from an optical waveguide with an active region (similar to that of FIG. 1) whose lateral faces are treated specularly. A two-dimensional pattern of microtiles 28 having a defect is implanted on the upper surface of the waveguide. The configuration of this pattern depends on the desired effect. In the present example, the microtiles have an approximately square upper face and are arranged in rows and columns and are regularly spaced within the rows and columns. Just one tile is missing, for example at the center of the pattern. Beneath the "empty" position (or "defect") 29, the optical field is the most intense.

In general, the implanted pattern on the surface, or close to the surface, of an optical waveguide may be periodic or aperiodic, and the shape of the implanted "tiles" may be different from that shown in FIG. 8. This pattern may have no "defect", or one or more "defects". Depending on the configuration of the pattern thus implanted, it is possible for the optical mode propagating in the component obtained to be finely controlled, and adjusted to the particular requirements of each application.

Thus, it is possible, for example, to control the profile of the laser beam or to produce microcavities or to adjust the dispersive properties of the plasma layer.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A method of improving the optical characteristics of multilayer optoelectronic components, comprising:
implanting ions using a beam, into discrete regions of at least one highly doped confinement layer of a multilayer structure layer so as to greatly reduce the concentration of the doping of the layer by forming periodic or pseudo-periodic patterns directly in the layers, and locally modify the refractive index of this layer thereby producing components whose refractive index varies periodically or pseudo-periodically.

2. The method as claimed in claim 1, wherein the implantation is made in a periodic pattern.

3. The method as claimed in claim 2, wherein the pattern includes at least one defect.

4. The method as claimed in claim 2, wherein the implantation is carried out on the surface.

5. The method as claimed in claim 2, wherein the implantation is carried out depthwise.

6. An ARROW-type waveguide, wherein it is produced using the method of claim 2.

7. A DFB-type laser, wherein it is produced using the method of claim 2.

8. An α-DFB-type laser with an oblique periodic structure, wherein it comprises an optical waveguide in which a corridor is bounded by two strips of high refractive index gradient that are produced using the method of claim 2.

9. The method as claimed in claim 1, wherein the implantation is made in an aperiodic pattern.

10. The method as claimed in claim 9, wherein the pattern includes at least one defect.

11. The method as claimed in claim 9, wherein the implantation is carried out on the surface.

12. The method as claimed in claim 1, wherein the implantation is made in a two-dimensional pattern.

13. The method as claimed in claim 12, wherein the pattern includes at least one defect.

14. The method as claimed in claim 12, wherein the implantation is carried out on the surface.

15. The method as claimed in claim 1, wherein the implantation is carried out on the surface.

16. The method as claimed in claim 1, wherein the implantation is carried out depthwise.

17. An ARROW-type waveguide, wherein it is produced using the method of claim 1.

18. A DFB-type laser, wherein it is produced using the method of claim 1.

19. An α-DFB-type laser with an oblique periodic structure, comprising: an optical waveguide in which a corridor is bounded by two strips of high refractive index gradient that are produced using the method of claim 1.

20. A QCL-type laser, wherein it is produced using the method of claim 1.

21. The method as claimed in claim 1, wherein the implantation forms the periodic or pseudo-periodic patterns at a predetermined depth below an upper surface of the layer by controlling an energy of the ion beam.

* * * * *